(12) United States Patent
Chinn et al.

(10) Patent No.: US 6,666,979 B2
(45) Date of Patent: Dec. 23, 2003

(54) DRY ETCH RELEASE OF MEMS STRUCTURES

(75) Inventors: Jeffrey D. Chinn, Foster City, CA (US); Vidyut Gopal, Santa Clara, CA (US); Sofiane Soukane, Sunnyvale, CA (US); Toi Yue Becky Leung, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 106 days.

(21) Appl. No.: 10/046,593

(22) Filed: Oct. 29, 2001

(65) Prior Publication Data

US 2003/0080082 A1 May 1, 2003

(51) Int. Cl.$^7$ .......................... H01L 21/00; B44C 1/22; C03C 15/00
(52) U.S. Cl. ................... 216/2; 134/3; 134/31; 216/58; 216/79; 438/706; 438/739; 438/745; 438/756
(58) Field of Search ............................... 216/2, 14, 57, 216/58, 73, 79; 134/1.3, 3, 28, 30, 31; 438/706, 723, 743, 735, 739, 745, 756

(56) References Cited

U.S. PATENT DOCUMENTS

| 6,027,571 A | 2/2000 | Kikuyama et al. ............. 134/3 |
| 6,096,149 A | 8/2000 | Hetrick et al. .............. 156/155 |
| 6,238,580 B1 | 5/2001 | Cole et al. ................ 216/2 |

FOREIGN PATENT DOCUMENTS

| WO | WO 99/34484 | 7/1999 |
| WO | WO 00/10315 | 2/2000 |

OTHER PUBLICATIONS

W. R. Ashurst et al., "Alkene Based Monolayer Films as Anti–Stiction Coatings for Polysilicon MEMS", *Solid–State Sensor and Actuator Workshop*, Hilton Head Island, South Carolina, pp. 320–323 (Jun. 2000).

J. M. Bustillo et al., "Surface Micromachining for Microelectromechanical Systems", *Proceedings of the IEEE*, vol. 86, No. 8, pp. 1552–1575 (Aug. 1998).

M. R. Houston et al., "Ammonium Flouride Anti–Stiction Treatment for Polysilicon Microstructures", *Transducers '95—Eurosensors IX*, pp. 210–213 (Jun. 1995).

J. Y. Lee et al., "Fabrication of Surface Micromachined Polysilicon Actuators Using Dry Release Process of HF Gas–Phase Etching", *IEDM*, vol. 96, pp. 761–764 (1996).

Y. Lee et al., "Dry Release for Surface Micromachining with HF Vapor–Phase Etching", *Journal of Microlectromechanical Systems*, vol.6, No.3, pp. 226–233 (Sep. 1997).

S. Lucas et al., "Polysilicon microswitch for planar antenna phase shifters", *SPIE*, vol. 2879, pp. 143–153 (1996).

Y. Matsumoto et al., "Three–axis SOI capacitive accelerometer with PLL C–V converter", *Sensors and Actuators*, vol. 75, pp. 77–85 (1999).

Y. Matsumoto et al., "Novel prevention method of stiction using silicon adodization for SOI structure", *Sensors and Actuators* A, vol. 72, pp. 153–159 (1999).

I. J. Raaijmakers et al., "Enabling technologies for forming and contacting shallow junctions in Si: HF–vapot cleaning and selective epitaxial growth of Si and SiGe", *J. Vac. Sci. Technol.* B, vol. 17, No. 5, pp. 2311–2320 (Sep./Oct. 1999).

*Primary Examiner*—William A. Powell
(74) *Attorney, Agent, or Firm*—Shirley L. Church

(57) ABSTRACT

The present invention pertains to a method of fabricating a surface within a MEM which is free moving in response to stimulation. The free moving surface is fabricated in a series of steps which includes a release method, where release is accomplished by a plasmaless etching of a sacrificial layer material. An etch step is followed by a cleaning step in which by-products from the etch step are removed along with other contaminants which may lead to stiction. There are a series of etch and then clean steps so that a number of "cycles" of these steps are performed. Between each etch step and each clean step, the process chamber pressure is typically abruptly lowered, to create turbulence and aid in the removal of particulates which are evacuated from the structure surface and the process chamber by the pumping action during lowering of the chamber pressure. The final etch/clean cycle may be followed by a surface passivation step in which cleaned surfaces are passivated and/or coated.

28 Claims, 2 Drawing Sheets

DRY ETCH RELEASE OF MEMS STRUCTURES

FIELD OF THE INVENTION

In general, the present invention relates to a method of dry, plasmaless etch of MEMS (micro-electro-mechanical systems) structures, which includes a release step in which gaps are opened (etched) between various structural surfaces. For example, surface machined cantilever beams and lever arms may be fabricated by etching away sacrificial layers within a structure; or, thin membranes or diaphragms for sensors or pumps may be created by hollowing out areas of a structure.

BRIEF DESCRIPTION OF THE BACKGROUND ART

Micromachining technology compatible with semiconductor processes is used to produce a number of devices such as piezoelectric motors containing cantilever beams, hinges, accelerometers, reflector antennae, microsensors, microactuators, and micromirrors, for example. One of the most popular microactuators is an electrostatic comb driver, due to its simplicity in fabrication and low power consumption. Surface micromachining fabrication processes for the electrostatic comb driver, as well as other beams and lever arms, have problems with stiction of such beams and lever arms to an underlying layer over which the beam or arm extends. The lever arm becomes deformed from its intended position, so that it does not extend out as desired. In the case of a membrane or diaphragm, the membrane or diaphragm becomes deformed from its intended position and may become stuck to an adjacent surface. Stiction is the number one yield limiting problem in the production of the kinds of devices described above.

FIGS. 1A through 1C are simple schematics showing a cross-sectional side view of a starting structure for surface machining of a lever arm, the desired machined lever arm, and a lever arm which has been rendered non-functional due to stiction, respectively.

The FIG. 1A structure shows a substrate layer 102 (typically single crystal silicon), a portion of which is covered with a sacrificial layer 104 (typically silicon oxide), and a lever arm layer 106 (typically polysilicon) which is in contact with and adhered to substrate layer 102 at one end of lever arm layer 106. FIG. 1B shows the FIG. 1A structure after the removal of sacrificial layer 104 to produce the desired free-moving lever arm 107. The height "h" of gap 108 between lever arm 107 and substrate 102, the length "l", and the cross-sectional thickness "t" of the lever arm 107 depend on the particular device in which the structure is employed. In many instances the relative nominal values of "h", "l", and "t" are such that capillary action during the fabrication process; or contaminants formed as byproducts of the fabrication process; or van der Waals forces; or electrostatic charges on the upper surface 110 of substrate layer 102 and/or on the undersurface 112 of lever arm layer 106 may cause lever arm 106 to become stuck to the upper surface 110 of substrate layer 102. This problem is referred to as "stiction", and is illustrated in FIG. 1C. Stiction may occur during formation of the lever arm 107 or may occur subsequent to fabrication of the device and during packaging, shipment, or use (in-use stiction) of the device. A single crystal silicon or polysilicon surface of the kind which is frequently used to fabricate a lever arm, beam, membrane or diaphragm is hydrophilic in nature, attracting moisture which may cause stiction.

Various processes have been developed in an attempt to prevent stiction from occurring during fabrication of micromachined arms and beams. For example, in U.S. Pat. No. 6,027,571 to Kikuyama et al., issued Feb. 22, 2000, the inventors describe a wet etching process for micromachining, where the wet etchant preferably includes a surfactant. (Abstract) The surfactant is said to improve wetability during etching so that etching uniformity of a silicon oxide film is improved; in addition, if a silicon surface is exposed during the etching, the roughness of the surface can be suppressed by the surfactant (Col. 2, lines 58–64). Crystalline particles which are byproducts produced during etching can be prevented from adhering to the wafer surface by adding surfactant to the surface treatment. (Col. 3, lines 29–32). The surfactant is evidently used in an attempt to reduce some of the factors which contribute to stiction.

In U.S. Pat. No. 6,069,149 to Hetrick et al, issued Aug. 1, 2000, the inventors disclose a method for fabricating an adhesion-resistant microelectromechanical device. Amorphous hydrogenated carbon is used as a coating or structural material to prevent adhesive failures during the formation and operation of a microelectromechanical device. (Abstract) The amorphous hydrogenated carbon (AHC) coating is applied on the micromachined device after removal of the sacrificial layer and release of the structure. The sacrificial layer is removed in a wet etching solution such as hydrofluoric acid or buffered HF acid. (Col. 7, lines 26–32.) The method is said to reduce adhesive forces between microstructure surfaces by altering their surface properties. The AHC is said to create a hydrophobic surface, which results in lower capillary forces and an associated reduction in stiction. (Col. 2, lines 66–67, continuing at Col. 3, lines 1–4.)

An article in IEEE Electron Devices Magazine, IEDM 96-761 (1996 IEEE), entitled "Fabrication of Surface Micromachined Polysilicon Actuators Using Dry Release Process of HF Gas-Phase Etching" by Jong Hyun Lee et al. describes a process developed for the dry-release of sacrificial oxide in polysilicon surface micro-machining. Using anhydrous HF gas with a $CH_3OH$ vapor catalyst (Page 30.1.1, last paragraph, first column), the authors successfully fabricated a vibrating micro-gyroscope structure with "virtually no process-induced stiction". (Abstract). The authors describe how one of the major issues in surface micromachining is process-induced stiction of highly compliant microstructures to an underlying layer. The stiction of the microstructures is attributed mainly to capillary forces developed during a drying step which follows wet etching of the sacrificial layer. The Lee et al. article references reports by other researchers which describe other methods which have been used in an attempt to solve the stiction problem. For example, Lee et al. mention the use of a micromechanical temporary support, sublimation of the final liquid (present after etching of the sacrificial layer) by freeze-dry, temporary photoresist support with subsequent plasma ashing, removing the final liquid through supercritical state, or using low surface tension liquids. The supercritical dry method is said to generate excellent results, but this method requires the use of high pressure equipment which is not desirable in a fabrication process, due to equipment cost and safety issues.

Applicants' review of the background art in general has indicated that stiction is the primary cause of low yield in the fabrication of MEMS devices. As mentioned above, stiction is believed to result from a number of sources, some of the most significant being capillary forces, surface contaminants, van der Waals forces, and electrostatic attraction. Factors which may contribute to stiction include: warpage due to residual stresses induced from materials; liquid-to-solid surface tension which induces collapse; drying conditions during processing; adverse and harsh forces from wet baths; aggressive designs (i.e. long and thin beams); surface-to surface attractions; inadequate cleaning techniques; aggressive cleaning techniques; and environments subsequent to fabrication, including packaging, handling, transportation, and device operation.

To reduce the probability of stiction subsequent to release of a beam, lever arm, membrane, or diaphragm (so that it extends over open space), a surface treatment may be applied and/or a coating may be applied over freestanding and adjacent surfaces. However, in some instances stiction occurs during the release process and prior to application of a stiction-preventing coating.

The present invention relates to a method of fabricating a MEM structure which reduces stiction due to fabrication process induced variables and which contributes to a reduced probability of stiction occurring during handling, transportation and device operation after fabrication.

SUMMARY OF THE INVENTION

The present invention pertains to a method of fabricating a surface within a MEM which is free moving in response to a stimulus. The free moving surface is fabricated in a series of steps which includes a release method, where release is accomplished by a plasmaless etching of a sacrificial layer material, followed by a cleaning step in which by-products from the etch process and other contaminants which may lead to stiction are removed. There are a series of etch and then clean steps so that a number of "cycles" of these steps are performed. The release method may be followed by a surface passivation step in which cleaned surfaces are passivated and/or coated, so that they repel elements and compounds which may be present in the ambient atmosphere which may induce stiction. The coating may also reduce charge accumulation on feature surfaces, so that the possibility of stiction by electrostatic attraction is reduced.

In the cyclic etch/cleaning procedure, a portion of a sacrificial layer is removed, followed by a cleaning step, and the process is repeated until the desired amount of sacrificial layer is removed. In some instances, the surface properties of the structure surfaces which were in contact with the sacrificial layer, and which remain after removal of the sacrificial layer, are not as desired after the final cycle. These surfaces are then treated to provide the desired surface properties. The number of etch/clean cycles required in a given instance depends on the dimensions of the free moving structure which is being fabricated.

When the sacrificial layer is an oxide, the etchant used to remove the sacrificial layer is typically a fluorine-containing etchant. When the sacrificial layer is an organic polymeric layer, the etchant used to remove the sacrificial layer is typically an oxygen-species containing etchant. When the sacrificial layer is a metal-containing layer, the etchant is typically a chlorine-containing etchant. The etchant is selected to etch the sacrificial layer more rapidly than other layers exposed to the etchant, and to minimize or avoid the formation of chemical compounds which are harmful to the MEM surfaces which remain after removal of the sacrificial layer. The cleaning agent used depends on the byproducts produced during etching of the sacrificial layer, the ease of removal of the cleaning agent (along with the byproducts which are removed with the cleaning agent), and the surface properties which are generated on the structure surfaces which are contacted by the cleaning agent.

In a first embodiment of the invention, the sacrificial layer is an oxide, and the structural surfaces adjacent the oxide include at least one of single crystal silicon (silicon), polysilicon, or silicon nitride. The etchant for removal of the oxide is a vapor of an HF/catalyst mixture. The most advantageous catalyst is water, as water provides a faster etch rate; however other polar molecules which can provide $OH^-$ ions may be used as a catalyst. Examples of other catalysts include chemical compounds which can be present in the vapor state under the same process conditions at which HF is in a vapor state, such as chemical compounds having the formula $C_xH_y(OH)_z$, where x ranges from 1–3, y ranges from 3–9 and z ranges from 1–2. Alcohols and ketones work well. Chemical compounds having the formula $C_aH_bO_c$, where a ranges from 1–3, b ranges from 2–8, and c ranges from 2–4 may also be used, such as acetic acid. Typically the catalyst concentration in the HF/catalyst mixture is less than about 25% by volume. It is important that the HF/catalyst mixture be maintained as a vapor in the process chamber, with the exception of a thin film (a few monolayers) on the surface of the substrate. Thus, the catalyst concentration in the HF/catalyst vapor is dependent on the temperature and pressure under which the etching of the sacrificial oxide layer is carried out. FIG. 2 provides a phase diagram for Anhydrous Hydrogen Fluoride which is generally indicative of the temperature and pressure conditions under which a vapor of HF can be maintained. This phase diagram has to be adapted for presence of the catalyst.

In the case of an HF/water mixture, where the ratio of HF:water is 10:1 or greater, the substrate temperature during etching is maintained between about 25° C. and about 50° C., and typically is maintained below about 45° C. The temperature of the process chamber walls is generally slightly higher than the substrate temperature, to prevent condensation. The pressure in the process chamber is slightly below that which would provide general condensation of the HF/water mixture on the substrate; fine tuned to provide the thin film monolayer of condensed HF/water mixture on the substrate surface. For process integration reasons, it is helpful when the process chamber is operated at less than one atmosphere of pressure, and the substrate temperature may be adjusted to accommodate operation at such pressure. Desirable operating pressures range between about 300 Torr and about 600 Torr, for example.

The cleaning agent used subsequent to the HF/catalyst etchant mixture is a vaporous chemical compound which is polar in nature. Examples include chemical compounds having the formula $C_xH_y(OH)_z$, where x ranges from 1–3, y ranges from 3–9 and z ranges from 1–2. Methanol, ethanol, and isopropyl alcohol (IPA) have been demonstrated to perform well as cleaning agents. Ketones such as acetone are expected to work well also. Additional example cleaning agents include chemical compounds having the formula $C_aH_bO_c$, where a ranges from 1–3, b ranges from 2–8, and c ranges from 2–4. Acetic acid, which is a compound having this formula, performs well as a cleaning agent.

In a second embodiment of the invention, the sacrificial layer may be an organic polymeric layer, and the structural surfaces adjacent the organic polymeric layer may include a metal. The etchant for removal of the organic polymeric sacrificial layer in this instance is typically an oxygen-containing active species which oxidizes the polymeric layer into a volatile reaction product which is easily removed from a process chamber. The cleaning agent used to remove reaction byproducts and contaminants may be one of the cleaning agents described above with reference to the first embodiment.

In a third embodiment of the invention, the sacrificial layer may be a metal-containing layer, and the structural surfaces adjacent the metal layer may include an oxide. The etchant for removal of the metal sacrificial layer in this instance typically is a chlorine-containing active species which reacts with the metal containing layer to provide volatile reaction products which are easily removed from a process chamber. The cleaning agent used to remove reaction byproducts and contaminants may be one of the cleaning agents described above with reference to the first embodiment.

An important feature in all embodiments of the invention is the use of more than one etch/clean cycle to fabricate the free moving structure such as a lever arm, beam, membrane or diaphragm, for example. The number of etch/clean cycles required depends on the feature being etched. For a beam or a lever arm, the cross-sectional dimensions of the arm, the unsupported length of the arm and the gap between the arm and the underlying substrate are important factors. For a beam or arm having an effective cross-sectional radius in the range of $2\mu$ or less, the longer the unsupported length of the arm, and the more narrow the gap between the arm and adjacent substrates, the more easily the unsupported arm or beam length can be deformed, and the larger the number of cycles which are necessary to avoid stiction during the fabrication process. The aspect ratio of the gap can be used to estimate the required number of cycles. The aspect ratio of the gap is the ratio of the length of the gap (the unsupported length of the beam or lever arm) to the minimum cross-sectional dimension of the gap. As a starting point, the aspect ratio can be maintained at about 1:1 and the number of cycles used can be nominally in the magnitude of the aspect ratio. For example, if the aspect ratio is 20:1, about 15–30 cycles may be used. One skilled in the art can adjust the number of etch/clean cycles depending on the results obtained from this starting point.

When the structural surfaces remaining after removal of the sacrificial layer include polysilicon or silicon nitride, surface treatment and/or application of a coating material may be helpful in reducing the tendency for stiction subsequent to device fabrication. Examples of coating materials which may be applied after removal of the sacrificial layer include alkylsilane-containing molecules, particularly an alkylhalosilane which is applied after oxidation of exposed substrate surfaces. Other surface coating materials such as primary alkenes may be applied over (reacted with) hydrogen terminated silicon (hydrogen terminated silicon may be achieved by treating a silicon surface with ammonium fluoride). However, the aklyslilane-containing molecules provide the advantage that they may be applied under similar process chamber conditions as those used in the etch/clean fabrication process. This makes it possible to carry out a release process in which a free moving structure is created and then to provide surface passivation and/or coating of fabricated substrates in the same process chamber, when necessary to prevent stiction. In the alternative, the etch/clean process may be carried out in one chamber of an integrated system, with the released structure then moved under controlled conditions into an adjacent process chamber where surface passivation and/or coating is carried out.

Figure 1A:
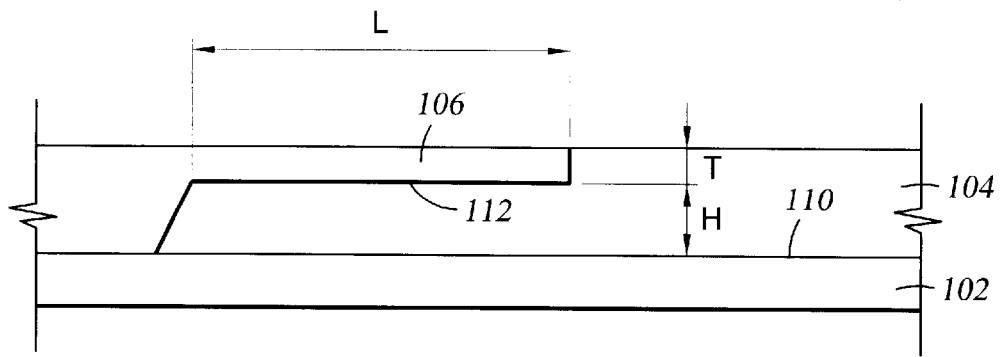
FIGS. 1A through 1C are simple schematics showing, respectively, a starting structure for surface machining of a lever arm, the desired machined lever arm, and a lever arm which has been rendered non-functional due to stiction.

The FIG. 1A schematic structure shows a substrate layer 102, a portion of which is covered with a sacrificial layer 104, and a lever arm layer 106 which is in contact with and adhered to substrate layer 102 at one end of lever arm layer 106.

Figure 1B:
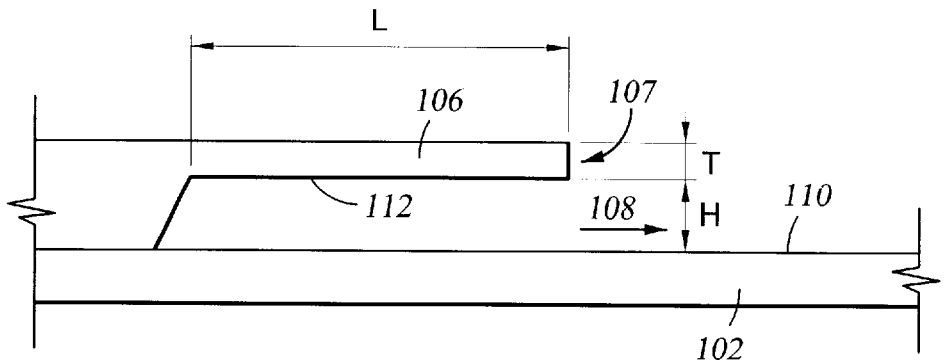

FIG. 1B shows the FIG. 1A schematic structure after the removal of sacrificial layer 104 to produce the desired free-moving lever arm 107.

Figure 1C:
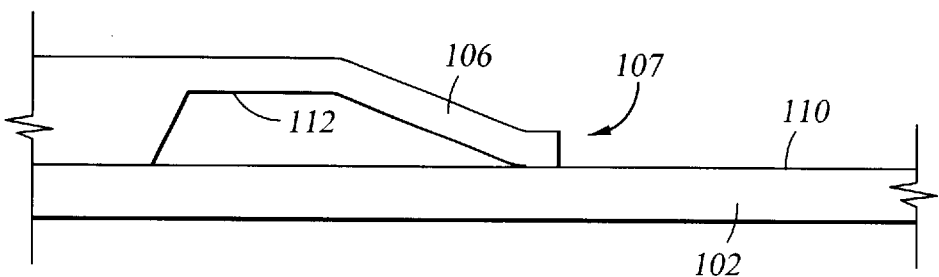

FIG. 1C illustrates a problem which is referred to as "stiction", where, during fabrication of the device including lever arm 107, or subsequent to fabrication and during use of the device, lever arm 107 becomes stuck to an adjacent surface (typically the substrate 102 beneath lever arm 107).

Figure 2:
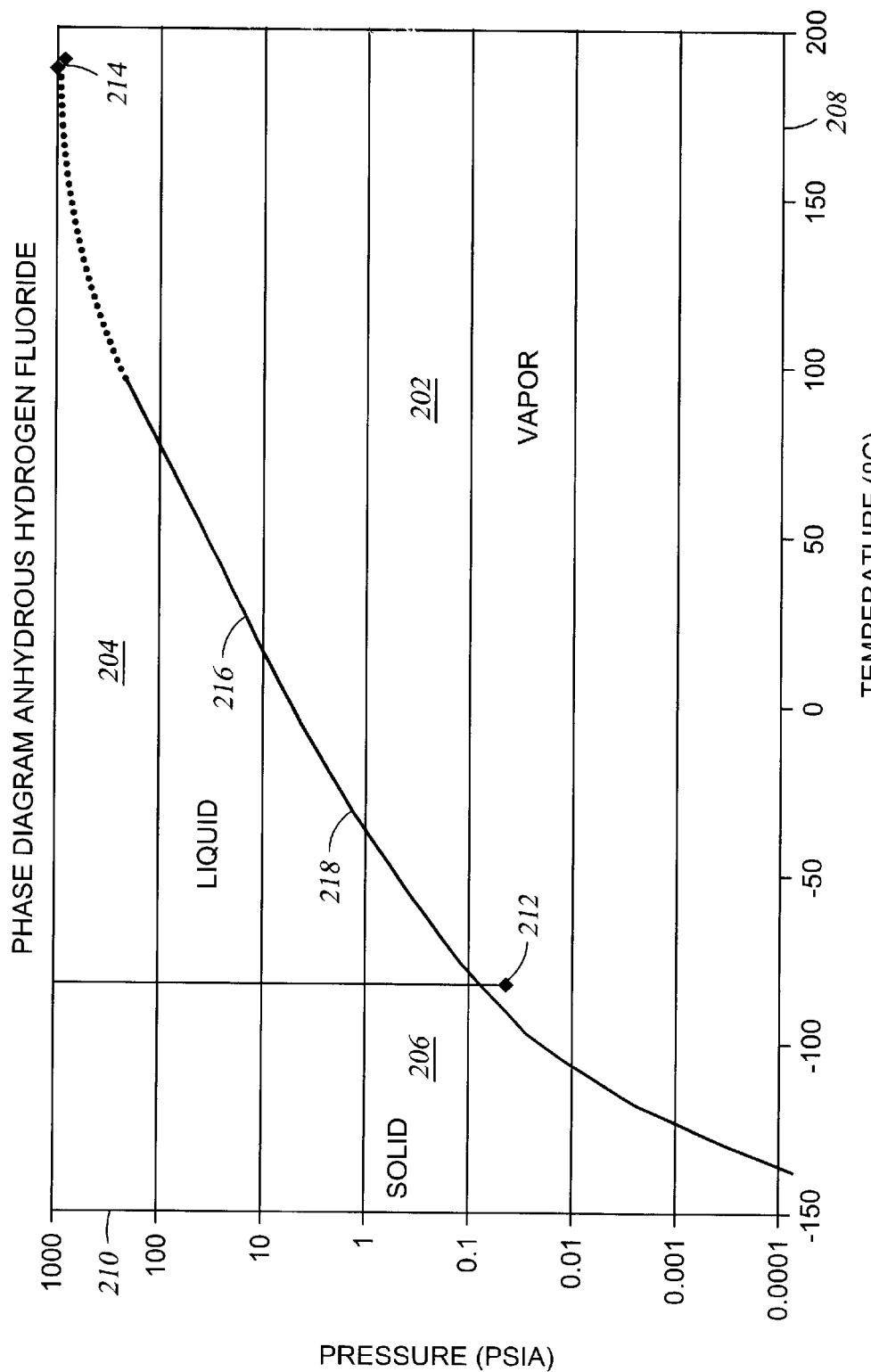

FIG. 2 is a phase diagram showing the phase in which anhydrous hydrogen fluoride is present as a function of pressure and temperature.

DETAILED DESCRIPTION OF THE INVENTION

As a preface to the detailed description, it should be noted that, as used in this specification and the appended claims, the singular forms "a", "an", and "the" include plural referents, unless the context clearly dictates otherwise.

As described above, the present invention pertains to a method of fabricating a released, free moving structure in a MEMs device. In particular, release of the free moving structure is obtained using a plurality of etch/clean cycles in a manner which reduces the probability of stiction during the release process. The release cleaning step used subsequent to the etch step in each cycle removes by-products from the etch process and contaminants on exposed substrate which may lead to stiction. The release method may be followed by a surface passivation step in which the cleaned surfaces are treated or coated, so that they repel elements and compounds which may be present in the ambient atmosphere and which tend to induce stiction. The treatment or coating may also reduce charge accumulation on feature surfaces, so that the possibility of stiction by electrostatic attraction is reduced.

EXAMPLES

Example One

Removal of a Silicon Oxide Sacrificial Layer

In one embodiment of the present invention a micromachined polysilicon actuator is fabricated. During fabrication of the actuator, a starting structure of the kind illustrated in FIG. 1A is used to generate a lever arm 107 of the kind shown in FIG. 1B. The actuator includes an actuation electrical contact pad (not shown). With respect to the FIG. 1A starting structure, a first portion of the upper surface 110 of a silicon substrate 102 is in contact with an overlying layer of silicon oxide 104, while a second portion of the upper surface 110 is in contact with a layer 106 of polysilicon. A portion of the bottom surface 112 of polysilicon layer 106 is also in contact with silicon oxide layer 104, in the area where silicon oxide layer 104 overlies silicon substrate 102, so that polysilicon layer 106 extends over the upper surface 110 of silicon substrate 102. Silicon oxide layer 104 then fills a gap having a height "h", between the upper surface 110 of silicon substrate 102 and the lower surface 112 of polysilicon layer 106. To create the lever arm shown in FIG. 1B, the silicon oxide layer 104 is removed. Thus, this silicon oxide layer 104 is referred to as a "sacrificial" layer.

To prevent the lever arm 107 shown in FIG. 1B from becoming stuck to silicon substrate 102 during fabrication, the etch process used to remove silicon oxide layer 104 must not place undue forces upon lever arm 107 which cause harmful deformation of lever arm 107. In addition, any byproducts and contaminants generated during the etch process which might cause stiction of lever arm 107 to substrate 102 must be removed.

Although a wet HF etch was first used to remove sacrificial silicon oxide layer 104, an incomplete removal of wet etchant created a capillary effect which tended to draw lever arm 107 toward substrate 102. This wet etch was replaced by an HF vapor etch, where etch by products of $H_2SiF_6$, $SiF_4$, and $H_3SiO_3$ are formed. The $H_3SiO_3$ by-product is not volatile, and leaves a residue on the polysilicon layer 106 and silicon layer 102 which causes stiction. Use of a wet rinse after completion of the HF vapor etch to remove the $H_3SiO_3$ creates an undesired capillary action force. In addition, there is some water present on the surface of the polysilicon lever arm 107 after removal of the sacrificial polysilicon using HF vapor etch. The more porous the polysilicon, the greater the amount of water present on the lever arm 107. This presence of water on the surface of lever arm 107 also induces stiction.

As mentioned in the Background Art discussion, J. H. Lee et al. developed a process in which $CH_3OH$ is used to catalyze an HF vapor etchant used for sacrificial etch of silicon oxide layer 104. The $CH_3OH$ catalyst was used to replace a water catalyst which was considered to contribute to the stiction problem. However, the $CH_3OH$ is not as good a catalyst as water ($H_2O$), and the silicon oxide etch takes longer when the $CH_3OH$ is used. We discovered that during etching of a TEOS (tetra-ethyl ortho silicate) oxide (an undoped dense oxide) sacrificial layer having a thickness of about $5\mu$, the etch time required for vaporous $HF/CH_3OH$ is about 30 minutes, compared with an etch time of only about 6 minutes for vaporous $HF/H_2O$. In addition, stiction may occur in the Lee et al. fabrication method if contaminants are formed from sources other than presence of moisture.

We developed a cyclic etch/clean cycle release method which permits the advantage of $H_2O$ catalysis of the vaporous HF etch process while avoiding the stiction problems normally associated with use of the $H_2O$ catalyst. In addition, the etch/clean cycle release method removes contaminants in general as the release process progresses, providing an advantage even when catalysts other than $H_2O$ are used. As previously described, the most advantageous catalyst is water, as water provides a faster etch rate; however other polar molecules which can provide $OH^{31}$ ions may be used as a catalyst. Examples of other catalysts include chemical compounds which can be present in the vapor state under the same process conditions at which HF is in a vapor state, such as chemical compounds having the formula $C_xH_y(OH)_z$, where x ranges from 1–3, y ranges from 3–9 and z ranges from 1–2. Alcohols and ketones which meet the requirements of this formula work well. In addition, acetic acid and other chemical compounds having the formula $C_aH_bO_c$, where a ranges from 1–3, b ranges from 2–8, and c ranges from 2–4 also perform well. In the cyclic etch/clean method, it is important that, during the etch step, water vapor (or any other catalyst) not condense on process chamber surfaces in general, while a thin layer (a few monolayers) of the HF/catalyst etchant is formed on the substrate surfaces to be etched. During the cleaning step, it is not necessary that the cleaning agent condense on any surfaces of the structure, which makes it easier to avoid capillary action in the gap space during the cleaning process.

FIG. 2 shows a phase diagram for anhydrous hydrogen fluoride. The phase of the anhydrous hydrogen fluoride, vapor 202, liquid 204, solid 206 is shown as a function of the temperature in ° C. on diagram axis 208 and as a function of the pressure in psia on diagram axis 210. Point 212 illustrates the triple point at which all three phases exist together, and point 214 illustrates the critical point at which liquid and vapor become identical. For an HF/catalyst etchant system, the phase diagram shown in FIG. 2 has to be adjusted to compensate for the presence of the catalyst. Typical process conditions are provided for an HF/water etchant system below. Other catalysts which are polar in nature can be expected to behave in a similar manner. As a starting point for an HF/catalyst etchant, one skilled in the art should select a desired operating temperature on axis 208 of the phase diagram and then use an operating pressure so that the vapor phase is present and so that the pressure coincides with the bottom 218 of line 216.

We have discovered that substrate temperature is the most sensitive variable in determining the etch rate of a silicon substrate, whether using a water catalyst or an IPA catalyst. In fact, temperature is so critical, that a 1° C.–2° C. temperature change may cause the etch rate to change by 50%. For example, a 5° C. decrease in substrate temperature (from 45° C. to 50° C.) caused the etch rate for single crystal silicon to decrease from 100 Å/minute to zero. With this in mind, it is best to set the substrate temperature and use pressure and catalyst concentration to control the etch rate. This also means that to achieve uniformity of etch across a substrate surface, it is necessary to have close control of the substrate temperature across the substrate surface. The substrate temperature may be controlled in some instances by controlling the inlet temperatures of various gas feeds into the process chamber. In addition, the substrate typically rests on a support pedestal which must either be thermally isolated from the substrate to provide temperature control; or more typically, the substrate support pedestal may be temperature controlled so that an accurate and uniform substrate temperature can be maintained. Although it is possible to adjust substrate temperature by gas flow over the substrate temperature, when operating at low pressures, gas flow is not advantageous for heat transfer.

The concentration of catalyst in the HF/catalyst mixture is generally less than about 25% by volume of the vapor space, and more typically is less than about 10% by volume in the vapor phase. In the HF/water embodiment of the invention, a water concentration of about 5% by volume of the vapor phase mixture has worked well. The substrate temperature during etching for the HF/water embodiment may be between about 25° C. and about 50° C., and is typically less than about 45° C. Although the process chamber pressure may exceed 14.7 psia (one atmosphere), in order to maintain the HF/water vapor phase while providing a thin film condensed layer of HF/water on the substrate surface, it is generally advantageous in terms of the etch/clean cycle if the process chamber pressure is below 14.7 psia (760 Torr). The operating pressure during the etch step generally ranges between about 250 Torr and about 4,000 Torr, with desirable operating pressures ranging from about 300 to about 600 Torr. For the process chamber we used, which had a volume of about 7,000 cc, we used a total HF vapor flow rate of about 1,800 sccm. The water was injected via a bubbler at a flow rate of about 200 sccm. A nitrogen carrier gas was fed into the bubbler at a rate of about 500 sccm. The nitrogen carrier gas was used to help maintain the vaporized catalyst in the vapor state. In the alternative, water may be measured as a liquid through a flow meter and then vaporized just prior to insertion into the process chamber. This latter method is referred to as Direct Liquid Inject™ (the injection system is available from Applied Materials, Inc. of Santa Clara, Calif.). A nitrogen carrier gas was fed into a port of the vaporizer, to enable obtaining a uniform and stable gas mixture while the mixture is transported into the process chamber. The flow rate of the nitrogen carrier gas was about 500 sccm. The total gas flow rate to the process chamber in general was about 2,500 sccm. Other carrier gases such as noble gases (helium, neon, argon, xenon, and krypton) may be used in place of nitrogen. The amount of carrier gas can be adjusted as necessary, depending on the processing equipment used (so long as overall conditions necessary to prevent general condensation of the etchant mixture while providing a thin film on the substrate surface are maintained). The nitrogen gas carrier was used to help maintain the vaporized catalyst in the vapor state. Alternatively, the HF/water mixture may be a liquid which is vaporized just prior to use, and the carrier gas also assists in obtaining a uniform and stable gas mixture while the mixture is transported into the process chamber.

A typical release method using a series of etch/clean cycles can be carried out over a time period of about 5 minutes to about 30 minutes. For a lever arm having an effective cross-sectional radius of the arm (shown as "t" in FIGS. 1A and 1B) of less than $2\mu$, it is desirable to maintain the aspect ratio of the gap formed during an individual etch step at about 1 or less to reduce the probability of stiction, as previously described. The aspect ratio is the ratio of the length of the gap to the minimal cross-sectional dimension of the gap. To carry out a release using etch/clean cycles sufficient to maintain the aspect ratio of 1 during the etch cycle, the approximate number of cycles required is nominally in the range of the aspect ratio. Thus, to etch the lever arm 107 illustrated in FIGS. 1A and 1B, the starting point for the number of etch cycles would be ("l"/"h") cycles. The starting point for the length of a cycle would be (5 min. to 15 min.)/("l"/"h"). Again, the length of a cycle may be adjusted as appropriate once initial data are gathered. For high aspect ratio gaps, mass transfer factors will cause the etch rate to slow exponentially as the number of cycles progresses. It is possible to adjust the length of each cycle as the etch progresses until this is not economically advantageous. In most instances, a constant etch/clean cycle time can be used up to completion of etch. Since the cleaning step is faster than the etch step, as described below, the portion of the etch/clean cycle which is the etch step may be considerably longer than the portion which is the clean step. The relative length of the etch portion of the cycle in comparison with the clean portion of the cycle depends on the aspect ratio of the structure to be etched. When l is much larger than h, for example, and a number of etch/clean cycles are used, as the number of etch/clean cycles increases, it is advantageous to have the time length of the clean portion of the cycle approach the time length of the of the etch portion of the cycle. However, when l is approximately equal to h, the time length of the etch cycle is approximately 10 times the time length of the clean cycle. For many of the lever arm structures, the time length of the etch portion of the cycle is approximately 3 to 10 times the length of the clean portion of the cycle.

At the end of each etch step, the pressure in the process chamber may be dropped abruptly, as rapidly as possible, to approximately 1 Torr or less. The clean step is then commenced. At the end of each clean step, the pressure in the process chamber is dropped abruptly, to approximately 1 Torr or less. This rapid drop in pressure is important, as it creates turbulence which helps in the removal of particulates from the surface of the substrate and from the process chamber as well. The speed at which the process chamber pressure can be dropped depends on the vacuum pump used to evacuate the process chamber and auxiliary apparatus. For the processing system described herein, it is possible to pump the process chamber down from 500 Torr to less than 1 Torr in less than about 15 seconds. Calculation of the etch step time must include the pump down time after the etch step, and calculation of the clean step time must include the pump down time after the clean step.

The cleaning agent used in combination with the HF/water mixture, for example, is a chemical compound having the formula $C_xH_y(OH)_z$, where x ranges from 1–3, y ranges from 3–9 and z ranges from 1–2. Methanol and IPA have been demonstrated to perform well, and ketones such as acetone are expected to perform well. In the alternative, the cleaning agent may have the formula $C_aH_bO_c$ where a ranges from 1–3, b ranges from 2–8 and c ranges from 2–4. One example cleaning agent having this formula is acetic acid.

For efficiency in carrying out the etch/clean cycle, it is advantageous to keep process conditions other than pressure relatively constant between the etch step and the clean step. Thus, the substrate temperature is typically maintained constant throughout each etch/clean cycle. The pressure may be maintained relatively constant during a given etch step or clean step, or may be adjusted to provide more turbulence. Pressure adjustment during the cleaning step as well as at the end of the cleaning step may be particularly helpful, depending on the cleaning agent used. In any case, the cleaning agent is advantageously maintained as a vapor. One skilled in the art can obtain the phase diagram for a particular cleaning agent from the literature and determine what the pressure range may be to maintain the cleaning agent in a vapor phase during the cleaning step at the substrate temperature used for the etch/clean cycle.

In our example, the cleaning agent was methanol, the substrate surface was at 45° C., and the pressure during the cleaning step was about 100 Torr. It is important to mention that pressures up to 500 Torr have been used during the cleaning step. It may be necessary to adjust the substrate temperature to enable use of higher pressures in the range of 500 Torr. The feed rate for the methanol cleaning agent described above was varied between about 20 mg/min and about 500 mg/min for the process chamber previously described. A feed rate of about 100 mg/min provided excellent cleaning results. Again, nitrogen was used as a carrier gas. When the feed rate of methanol to the process chamber was about 100 mg/min., the nitrogen feed rate was about 500 sccm. Typically the methanol was added by Direct Liquid Inject™, where the liquid methanol was measured through a flow meter and was vaporized prior to insertion into the process chamber. The nitrogen carrier gas was fed into a port in the vaporizer so that the exiting gas contained both methanol and nitrogen. The time period necessary for the cleaning step typically ranges from about 60 seconds to about 120 seconds. As mentioned above, this is shorter than a typical etch step, which may require from about 120 seconds to about 600 seconds. In addition, as mentioned above, after each etch step and each clean step, there is a pump down time period to evacuate the process chamber, which time period is typically less than about 15 seconds.

It is also possible to use a clean step in which some HF is present. When the clean step is carried out using $HF/C_xH_yOH_z$, the volume % of the mixture which is $C_xH_yOH_z$ ranges from about 5% to about 25%. The time period of the etch step relative to that of the clean step is reduced, since some etching is occurring during the clean step. Typically an etch step is carried out for a time period ranging from about 60 seconds to about 450 seconds, and more typically an etch step is carried out for a time period ranging from about 90 seconds to about 180 seconds. The clean step is carried out for a time period ranging from about 18 seconds to about 120 seconds, and more typically from about 30 seconds to about 60 seconds.

Example Two

Application of a SAM

Depending on the device and the end-use application, it may be desirable to use a subsequent surface passivation treatment, such as an ammonium fluoride treatment and/or to apply a coating over the substrate which will prevent stiction during handling and use of the device. Self Assembling Monolayer (SAM) coatings are known in the art. One of the more advantageous SAMs is the coating described in U.S. Pat. No. 5,403,665, the subject matter of which is hereby incorporated by reference in its entirety. In particular, the exposed polysilicon, silicon, or silicon nitride surfaces are exposed to an oxidant. Oxidation methods known to those skilled in the art are applicable, and may be carried out in the same process chamber as that used for the etch/clean cycle steps. After exposure to an oxidant, the exposed surfaces are contacted with vapor-phase alkylsilane-containing molecules. Alkylhalosilane reagents such as alkylchlorosilane perform particularly well. Specific examples include octyldecyltrichlorosilane (OTS), 1-H,1-H, 2-H,2-H-perfluorodecyltrichlorosilane (FDTS), and dimethyldichlorosilane (DMDS). These reagents are introduced into the process chamber by bubbling an anhydrous, inert gas through a liquid source of the alkylsilane-containing reagent to transport the reagent in vapor phase into the reaction chamber. In the alternative, a Direct Liquid Inject™ system may be used in which the flow rates of the reagents are measured as a liquid and then the liquids are vaporized just prior to insertion into the process chamber, with inert carrier gas being fed into a port of the vaporizer. Typically the reaction between the alkylsilane and the exposed substrates is carried out at a substrate temperature ranging from about 15° C. to about 100° C., at a pressure ranging from about 10 Torr to about 12 Torr. The pressure is low because it is desired to produce only a few monolayers or a single monolayer on the substrate surface. This reaction may also be carried out in the same processing chamber as that described with reference to the etch/clean cycle steps and the oxidation step, providing a process integration which provides significant production cost savings.

An alternative protective coating by treatment with an alkene-based monolayer is described in a paper "Alkene based monolayer films as anti-stiction coatings for polysilicon MEMS" by W. R. Ashurst et al., which was presented at the conference titled: Technical Digest. Solid-State Sensor and Actuator Workshop (TRF Cat. No. 00TRF-0001 p. 320–323) at Hilton Head Island, S.C., USA, Jun. 4–8, 2000.) In particular, a primary alkene (e.g. 1-octadecene) is reacted with hydrogen terminated silicon. This antistiction coating is said to have advantages over the previously reported octadecyltrichlorosilane (OTS) and 1H,1H,2H,2H-perfluorodecyltrichlorosilane (FDTS) SAMS, because it does not produce HCl at any stage in the monolayer formation (the HCl is a toxic gas which requires an elaborate exhaust process); does not require the formation of an intervening oxide layer; and is insensitive to relative humidity. After rinse of an HF etched structure, the structure was rinsed with IPA. The structure was then rinsed with 1-octadecene. The structure was then placed in a reactor containing an octadecene coating solution. The solution was a 9:1 v/v solution of hexadecane: 1-octadecene. After the structure was placed inside the reactor and the lid was sealed, a dry nitrogen gas was used to purge oxygen from the vapor space above the coating solution. The nitrogen gas flow was maintained throughout a heating process in which the reactor was heated to 180° C. and held at that temperature for 30 minutes. After this film generation step, the substrates were removed from the coating solution and rinsed with petroleum ether, followed by IPA. The disadvantage of this method is the need to use a liquid reactant to produce the SAM, the high reaction temperature required, and the need to use subsequent wet rinse steps.

The above described embodiments are not intended to limit the scope of the present invention, as one skilled in the art can, in view of the present disclosure, expand such embodiments to correspond with the subject matter of the invention claimed below.

We claim:

1. A method of fabricating a surface within a MEM structure, which surface is free moving in response to stimulation, comprising:
   a) etching a portion of an oxide-comprising sacrificial layer present within said structure using a vaporous HF etchant;
   b) cleaning surfaces exposed during said etching;
   c) repeating steps a) and b) until the desired amount of said sacrificial layer has been removed.

2. The method of claim 1, wherein said vaporous HF etchant is a mixture of vaporous HF with water vapor, whereby the rate of etching of said sacrificial layer is increased.

3. The method of claim 2, wherein the volume % of HF in said HF water vapor mixture is 75% or greater.

4. The method of claim 1 or claim 2, wherein a carrier gas is used in combination with said vaporous HF etchant.

5. The method of claim 4, wherein said carrier gas is selected from the group consisting of nitrogen, helium, neon, argon, xenon, krypton, and mixtures thereof.

6. The method of claim 1, wherein a temperature of a surface of said structure is less than about 45° C. during step a), and wherein a pressure in a process chamber in which step a) is carried out is such that said HF etchant is in a vapor phase except at said surface, whereby a thin film of HF etchant is formed on said surface.

7. The method of claim 2, wherein a temperature of a surface of said structure is less than about 45° C. during step a), and wherein a pressure in a process chamber in which step a) is carried out is such that said HF and said water are in a vapor phase except at said surface, whereby a thin film of HF etchant and water is formed on said surface.

8. The method of claim 1, said vaporous HF etchant is a mixture of vaporous HF with a catalyst, wherein said catalyst is a chemical compound having the formula $C_xH_y(OH)_2$, where x ranges from 1–3, y ranges from 3–9, and z ranges from 1–2.

9. The method of claim 1, wherein said vaporous HF etchant is a mixture of vaporous HF with a catalyst, wherein said catalyst is a chemical compound having the formula $C_aH_bO_c$, where a ranges from 1–3, b ranges from 2–8, and c ranges from 2–4.

10. The method of claim 8 or claim 9, wherein the volume % of HF in said HF and catalyst mixture is 75% or greater.

11. The method of claim 10, wherein a carrier gas is used in combination with said vaporous HF.

12. The method of claim 11, wherein said carrier gas is selected from the group consisting of nitrogen, helium, neon, argon, xenon, krypton, and mixtures thereof.

13. The method of claim 11, wherein a temperature of a surface of said structure is less than about 45° during step a), and wherein a pressure in a process chamber in which step a) is carried out is such that said HF and said catalyst are in a vapor phase except at said surface, whereby a thin film of HF and said catalyst is formed on said surface.

14. The method of claim 1 or claim 2 or claim 7 or claim 8, wherein said cleaning is carried out using a vaporous chemical compound having the formula $C_xH_yOH_z$, where x ranges from 1–3, y ranges from 3–9, and z ranges from 1–2.

15. The method of claim 1, wherein said cleaning is carried out using a vaporous mixture of HF and a chemical compound having the formula $C_xH_yOH_z$, where x ranges from 1–3, y ranges from 3–7, and z ranges from 1–2.

16. The method of claim 1, or claim 2, or claim 8, or claim 9, wherein said free moving surface is part of a beam or an arm, and wherein etching away of said sacrificial layer produces a gap between said beam or arm and an underlying substrate.

17. A method of fabricating a surface within a MEM structure, which surface is free moving in response to stimulation, comprising:
   a) etching a portion of a sacrificial layer present within said structure;
   b) cleaning surfaces exposed during said etching;
   c) repeating steps a) and b) until the desired amount of said sacrificial layer has been removed, wherein said surface which is free moving is part of a beam or an arm, wherein etching away of said sacrificial layer produces a gap between said beam or arm and an underlying substrate, wherein said arm or beam includes a cross-sectional dimension of less than about $2\mu$, and wherein said gap has an aspect ratio of about 2:1 or greater.

18. The method of claim 17, wherein the number of times steps a) and b) are repeated is nominally in the range of said gap aspect ratio.

19. The method of claim 8 or claim 9, wherein a temperature of a surface of said structure is less than about 45° C. during step a), and wherein a pressure in a process chamber in which step a) is carried out is such that said HF and said catalyst are in a vapor phase except at said surface, whereby a thin film of HF and said catalyst is formed on said surface.

20. The method of claim 1, or claim 8, or claim 9, wherein steps a), b), and c) are carried out in the same process chamber.

21. The method of claim 1 or claim 17, wherein step c) is followed by a step d) in which exposed MEM surfaces are treated with an agent which reduces or prevents stiction during subsequent processing, handling or use.

22. The method of claim 21, wherein said treatment includes application of a coating.

23. The method of claim 22, wherein prior to application of said coating, exposed surfaces of said structure are pre-treated by exposing said surfaces to a chemical agent selected from the group consisting of an oxygen-comprising plasma, ammonium fluoride, and combinations thereof.

24. The method of claim 21, wherein steps a), b), c), and d) are carried out in the same process chamber.

25. The method of claim 22, wherein said coating is an alkene-based monolayer.

26. The method of claim 23, wherein said coating is generated from a vapor-phase alkylsilane-containing molecule.

27. The method of claim 21, wherein said step a) etching is carried out using a vaporous etchant.

28. The method of claim 23, wherein said coating is an alkene-based monolayer.

* * * * *